United States Patent [19]
Jain et al.

[11] Patent Number: 5,290,727
[45] Date of Patent: Mar. 1, 1994

[54] METHOD FOR SUPPRESSING CHARGE LOSS IN EEPROMS/EPROMS AND INSTABILITIES IN SRAM LOAD RESISTORS

[75] Inventors: Vivek Jain, Milpitas; Dipankar Pramanik, Cupertino; Subhash Nariani, San Jose, all of Calif.

[73] Assignee: VLSI Technology, Inc., San Jose, Calif.

[21] Appl. No.: 860,370

[22] Filed: Mar. 30, 1992

Related U.S. Application Data

[63] Continuation-in-part of Ser. No. 794,922, Nov. 20, 1991, which is a continuation-in-part of Ser. No. 775,085, Oct. 11, 1991, which is a continuation-in-part of Ser. No. 476,089, Mar. 5, 1990, Pat. No. 5,057,897.

[51] Int. Cl.$^5$ .................................... H01L 21/70
[52] U.S. Cl. ............................ 437/52; 437/40; 437/43; 437/48; 437/235; 437/238
[58] Field of Search .............. 437/29, 40, 41, 43, 437/48, 52, 195, 228, 235, 238; 357/23.5, 51

[56] References Cited

U.S. PATENT DOCUMENTS

| | | | |
|---|---|---|---|
| 4,398,335 | 8/1983 | Lehrer | 437/195 |
| 4,458,407 | 7/1984 | Hoeg, Jr. et al. | 437/52 |
| 4,717,943 | 1/1988 | Wolf et al. | 357/23.5 |
| 4,764,484 | 8/1988 | Mo | 437/195 |
| 4,810,673 | 3/1989 | Freeman | 148/DIG. 27 |
| 5,057,897 | 10/1991 | Nariani et al. | 357/49 |

OTHER PUBLICATIONS

S. Yoshida et al. "Improvement of Enourance to Hot Carrier Degradation by Hydrogen Blocking P-510" IEDM 1988 pp. 22-25.

*Primary Examiner*—Tom Thomas
*Attorney, Agent, or Firm*—Flehr, Hohbach, Test, Albritton & Herbert

[57] ABSTRACT

Suppression of charge loss and hot carrier degradation in EEPROMs and EPROMs, and of instability in the polysilicon pull-up resistors associated with SRAMs is achieved by the inclusion of at least one layer of silicon-enriched oxide in the MOS structure. In such MOS structures, the silicon-enriched oxide layer may be disposed immediately beneath the interlayer dielectric layer, or immediately beneath the inter-metal oxide layer, or immediately beneath the passivation layer, or in any combination of these locations. Each silicon-enriched oxide layer preferably contains at least about $10^{17}$ per cm$^3$ dangling bonds.

17 Claims, 4 Drawing Sheets

METHOD FOR SUPPRESSING CHARGE LOSS IN EEPROMS/EPROMS AND INSTABILITIES IN SRAM LOAD RESISTORS

PREDECESSOR APPLICATIONS

This application is a continuation-in-part of application Ser. No. 07/794,922 (filed Nov. 20, 1991), which is a continuation-in-part of application Ser. No. 775,085 (filed Oct. 11, 1991) which is a continuation-in-part of application Ser. No. 07/476,089 (filed Mar. 5, 1990), which application issued as U.S. Pat. No. 5,057,897 on Oct. 15, 1991.

FIELD OF THE INVENTION

The present invention relates generally to fabricating semiconductor integrated circuit ("IC") MOS and MOS storage devices, and more particularly to a method and structure providing internal passivation to suppress hot carrier degradation in MOS devices, to suppress charge loss in memory devices such as electrically programmable read only memory ("EEPROM") devices and electrically erasable and programmable read only memory ("EPROM") devices, and to preserve stability of pull-up resistors in static random access memory ("SRAM") devices.

BACKGROUND OF THE INVENTION

Metal-oxide-silicon ("MOS") devices in general and MOS memory devices in particular can suffer performance and reliability degradation from a number of sources. For example, all MOS devices can suffer from hot carrier degradation. Memory devices such as electrically programmable read only memory ("EEPROM") devices, electrically erasable and programmable read only memory ("EPROM") devices also can suffer from charge loss, which affects their ability to reliably store data. Static random access memory ("SRAM") devices can suffer from trapped mobile carriers that affect the stability of associated polysilicon pull-up resistors, which renders accurate data readout difficult.

Before examining the nature of these problems and such solutions as are known in the art, it is helpful to briefly review the fabrication of MOS devices, including memory devices.

MOS integrated circuits typically provide many MOS devices fabricated on a substrate, with electrical isolation between adjacent devices provided by a field oxide layer. Typically a semiconductor layer comprising active source and drain regions for the MOS devices is covered by gate oxide regions, which regions are in turn covered by first polysilicon gate deposits (commonly called "polysilicon 1" or "poly 1" level gates). In charge storage memory devices such as EEPROMs and EPROMs, second polysilicon gate regions are also formed (known as "polysilicon 2" or "poly 2" level gates), overlying the first gate regions. An inter-gate oxide separates the two gate levels.

An interlayer dielectric ("ILD") such as boron phosphorous silicate glass ("BPSG") is then formed to insulate the gate regions from an overlying first level of conductive traces (commonly called "metal 1").

An inter-metal-oxide ("IMO") layer is then provided to insulate the layers thus described from an overlying second level of conductive metal traces (commonly called "metal 2"). The IMO layer typically includes a spin-on-glass ("SOG") layer that may be organic. The SOG layer is applied as a liquid to planarize or even-out the topography, primarily the valleys created by the underlying metal traces.

Finally, an outermost passivation layer is formed to protect the underlying integrated circuit from external sources of degradation. This outermost or "topside" layer typically includes a plasma enhanced chemical vapor deposition ("PECVD") of silane or tetra-ethyl-ortho-silicade ("TEOS") oxide.

Although the outermost passivation layer provides some protection against external sources of degradation, the underlying MOS devices are also susceptible to internal degradation. Sources of internal degradation include charge buildup, charge trapping, and the relatively large electric fields induced by backend processing.

Some sources of internal degradation have been successfully dealt with. For example a detrimental field-inversion can result from hydrogen in a nitride passivation layer migrating downward into a carbon-bearing layer such as an organic SOG layer. The resultant H—C interaction forms positive charges (or species) that can impress a voltage in excess of a substrate threshold voltage across the isolation channel oxide. The resultant isolation breakdown can invert the substrate beneath the affected oxide layer, thus permitting the flow of undesired inter-device leakage current. Hot carrier degradation can also result from such interaction.

The above-referenced U.S. Pat. No. 5,057,897 discloses the use of a silicon-enriched oxide beneath the passivation layer to reduce such parasitic leakage. Preferably the silicon-enriched oxide is formed within the IMO layer on either side of the SOG. Dangling bonds associated with the silicon-enriched oxide trap or neutralize the charge, minimizing the formation of parasitic transistors and leakage paths due to field inversion.

However due to a variety of mechanisms, undesired charges can be impressed on any of the dielectric layers, which charges need not originate from any interaction between a nitride passivation layer and an organic SOG layer. The above referenced application Ser. No. 775,085 discloses the use of one or more amorphous silicon layers to further trap or neutralize such charges that could otherwise contribute to inversion of isolation field oxides. Such amorphous silicon layers may be formed on either side of an SOG layer, and/or on either side of the BPSG layer. As such, the region wherein charges are trapped or generated preferably lies above the amorphous-silicon layer(s).

Hot carrier reliability affects all MOS devices, and can be important in MOS memory devices. Hot carrier lifetime depends upon device structure, doping densities, gate oxide thicknesses, the strength of applied fields, and the like. Long hot carrier lifetime is desired (i.e., months or years), but as noted fabrication process steps including backend steps can shorten hot carrier lifetime, with the result that MOS memory devices suffer performance and reliability degradation.

As MOS device sizes shrink and packing densities increase, there is an increase in the magnitude of the electric field to which the MOS devices are exposed. Unfortunately these increased field intensities create ionization regions wherein valence bonds are too easily broken. Hot carriers injected into these regions can readily damage the gate oxide-substrate interface by breaking these bonds. The result is that holes and electrons become trapped within the gate oxide. These trapped charges can undesirably alter and render less stable the MOS device characteristics including threshold voltage, conductance, and drive current levels. In addition, the increased use of plasma-assisted etching and deposition processing can further degrade hot electron reliability, primarily affecting hot carrier trapping.

It is known to use lightly doped drain structures to somewhat improve hot carrier lifetimes by reducing the electric fields to which a MOS device is subjected. However backend high voltage plasma deposition or etching processes, and the presence of SOG layers can still degrade hot carrier lifetime. The above-referenced application Ser. No. 07/794,922 discloses the use of silicon-enriched layers to provide a measure of internal passivation from backend induced hot carrier degradation. The silicon-enriched layers are disposed beneath any layer that may be the source of moisture, carbon and hydrogen, for example beneath each of the BPSG, SOG and passivation layers.

Needless to say, reliable data retention and data readout is all important in MOS memory devices. Unfortunately the performance and reliability of memory devices is subject to degradation from many sources, including those described above. For example, in EEPROMs and EPROMs, charged impurity ions can penetrate the BPSG layer, where they are attracted to the floating gate used to store data, thus degrading data retention. Memory data retention can also be adversely affected by effects remote from the floating gate, due to mechanisms not entirely understood at present. Although providing increased phosphorus content in the ILD is known to retard charge loss, further measures are still needed to produce EEPROMs and EPROMs that can reliably store data for long periods of time. Similarly, further measures are needed to protect SRAM data readout from migrating species induced instability of the pull-up resistors.

While the above-described patent and two pending patent applications disclose solutions to some of the problems affecting MOS device performance, further solutions are desired, especially with respect to MOS memory devices. What is needed is a method and structure for internally passivating MOS devices including memory devices against backend-processing induced degradation. Such method and structure should suppress charge loss in EPROM/EEPROM devices, and enhance stability of polysilicon load resistors in SRAM devices. The present invention discloses such methods and structures.

SUMMARY OF THE INVENTION

In summary, within a MOS device, the present invention suppresses charge loss and hot carrier degradation resulting from backend processing. Charge loss is minimized and hot carrier lifetime protected by including one or more layers of silicon-enriched oxide within the memory device structure. Hot carrier lifetime improvement exceeds approximately one order of magnitude contrasted to similar structures without at least onesilicon-enriched oxide layer according to the present invention. In EEPROMs and EPROMs, charge loss including loss in the floating gate region is reduced, and in SRAMs instability in the polysilicon pull-up resistors is reduced.

According to the present invention, a layer of silicon-enriched oxide is disposed adjacent and immediately beneath the interlevel dielectric layer, and/or adjacent and immediately beneath the inter-metal oxide layer, and/or adjacent and immediately beneath the passivation layer. Preferably each such layer silicon-enriched oxide contains at least about $10^{17}$ per $cm^3$ dangling bonds.

In an SRAM embodiment, the pull-up resistors formed at the first polysilicon level (as is the MOS device gate) are covered by at least one and perhaps three such layers of silicon-enriched oxide. So situated, the pull-up resistors receive protection from the effects of migrating species present in layers above the associated active MOS device and resistor. The result is that such impurities have relatively little effect on the conductance of the polysilicon comprising the pull-up load resistors, and thus a more stable resistor results. This improved resistor stability enables a more stable voltage readout of data levels stored in the SRAM.

In EEPROM and EPROM devices, both the poly 1 and poly 2 level gates are covered by at least one and perhaps three such layers of silicon-enriched oxide. So situated, the gates and especially the floating gate used to store data, are protected from hot carriers and from charge loss.

Other features and advantages of the invention will appear from the following description in which the preferred embodiments have been set forth in detail in conjunction with the accompanying drawings.

DESCRIPTION OF THE PREFERRED EMBODIMENTS

Figure 1A:
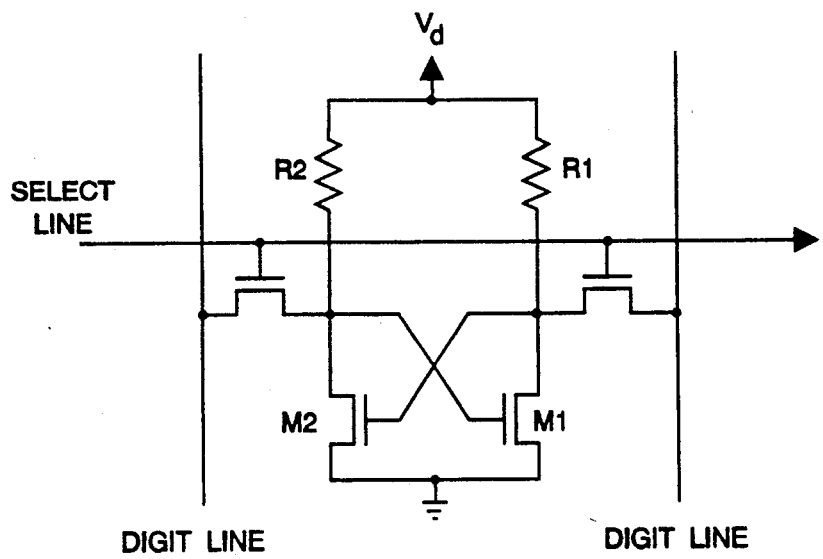
FIG. 1A is a schematic of a portion of an MOS SRAM array.

FIG. 1A depicts a static random access memory ("SRAM") that includes typically polysilicon pull-up load resistors $R_1$, $R_2$ coupled respectively to the drain terminals of NMOS devices M1, M2. For reliable data readout from an array of such SRAMs, it is important that a close tolerance be maintained between all of the pull-up resistors. Unfortunately migrating species within layers above the active MOS device can become trapped, undesirably affecting the conductivity and stability of polysilicon pull-up load resistors in SRAMs. The resultant poor tolerance in pull-up resistors can lead to erroneous voltage readouts that degrade SRAM performance and reliability.

Figure 1B:
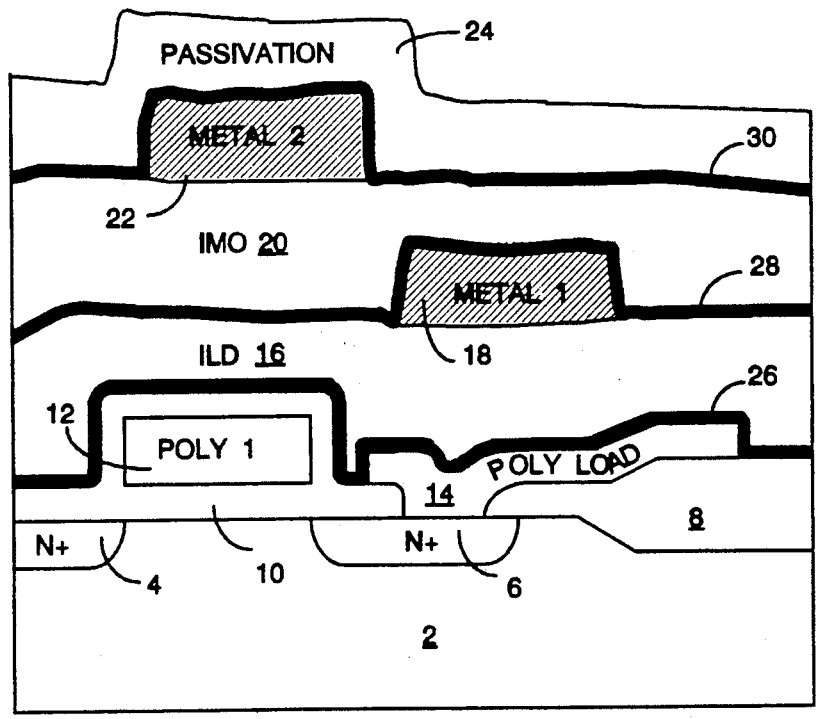
FIG. 1B is a cross-section of a MOS semiconductor implementation of a portion the circuit of FIG. 1A.

FIG. 1B is a semiconductor cross-section showing a preferred implementation of a portion of what is shown in FIG. 1A, namely M1 and $R_1$. The layers depicted in FIG. 1B are formed using conventional semiconductor fabrication techniques well known to those skilled in the relevant art. Such techniques include chemical vapor deposition, high temperature oxidation, photolithographic patterning, and the like. Not depicted are vias or vertical interconnections, which form no part of the present invention.

A p-type silicon substrate 2 is implanted with n-type dopants to create source 4 and drain 6. Channel stop and field oxide regions, collectively depicted as 8, are grown or deposited to provide electrical isolation between adjacent devices such as transistor M1 on the substrate. A gate oxide layer 10 is grown and a typically polysilicon/polycide gate 12 is formed over the substrate channel region generally between the source and drain regions 4, 6. Commonly this gate layer 12 is called the first polysilicon or "poly 1" level. Collectively source and drain regions 4, 6 and the portion of substrate 2 therebetween will be referred to as the active region, which together with gate 12 comprise MOS field effect transistor M1. It is to be understood that other substrate, dopant types and materials could be used instead of what has been and will be described.

Figure 3A:
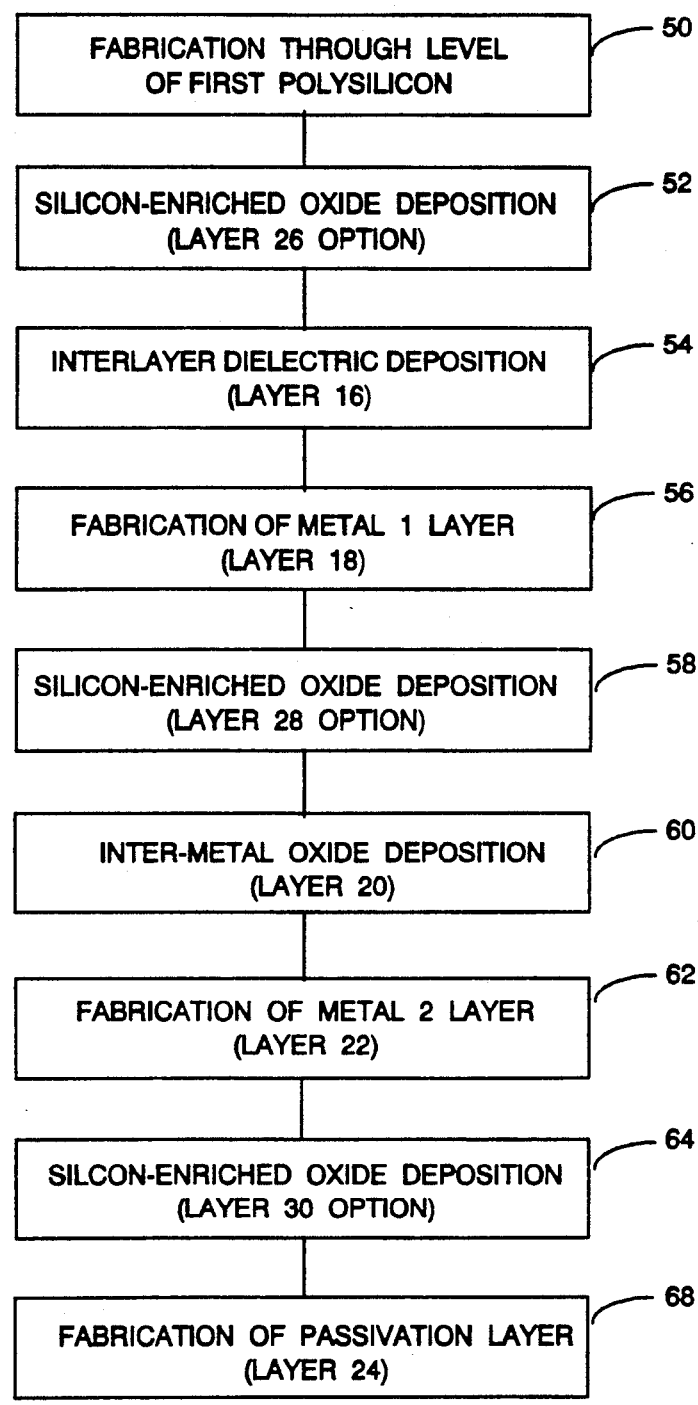
FIG. 3A is a flowchart for manufacturing the structure of FIG. 1B.

In FIG. 1A the load resistor $R_1$, depicted as 14, is preferably deposited at the first polysilicon level during the same processing step that creates gate 12. With reference to FIG. 3A, the processing steps described above are depicted collectively as step 50.

An interlayer dielectric ("ILD") 16 is deposited over the various elements formed from the first layer of polysilicon. The ILD deposition is shown as step 54 in FIG. 3A. (Step 52 will be described below.) The ILD commonly includes boron phosphorous silicate glass ("BPSG") and insulates the level containing gate 12 and the polysilicon load resistor from an overlying first layer of conductive traces 18 (commonly called "metal 1"). The metal 1 deposition is shown as step 56 in FIG. 3A.

A layer of inter-metal-oxide ("IMO") 20 is then formed over the ILD and first metal layers, which process is depicted as step 60 in FIG. 3A. (Step 58 will be described below.) As noted, the IMO layer 20 typically includes a spin-on-glass ("SOG") layer that, planarizes or evens out the underlying topography. A second layer of conductive traces 22 (commonly called "metal 2") is formed over the IMO, shown as step 62 in FIG. 3A. Finally, a protective uppermost passivation layer 24 is formed over the entire integrated circuit thus formed, this process depicted as step 68 in FIG. 3A. (Step 64 will be described below.) Passivation layer 24 commonly includes an enhanced chemical vapor deposition ("PECVD") of silane or tetra-ethyl-ortho-silicade ("TEOS") oxide.

According to the present invention, one or more layers of silicon-enhanced oxide 26, 28, 30 are included in the integrated circuit being formed. With reference to FIG. 1B, one such layer 26 may be disposed adjacent and immediately beneath the ILD layer 16, formation of this layer depicted as step 52 in FIG. 3A. Another such layer 28 may be disposed adjacent and immediately beneath the IMO layer 20, shown as step 58 in FIG. 3A. A third such layer 30 may be disposed immediately beneath the passivation layer 24, this process shown as step 64 in FIG. 3A. According to the present invention, a chosen one, two or three of levels 26, 28, 30 is provided. For example, level 26 might be desired in a single metal process, level 28 in a double metal process, and level 30 depending upon the nature of the passivation layer 24.

Figure 2A:
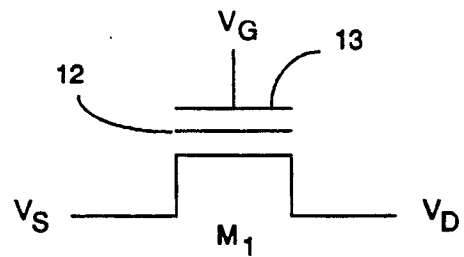
FIG. 2A is a schematic of a MOS memory device such as an EEPROM or EPROM.

FIG. 2A depicts a MOS field effect transistor M1 that has a floating gate 12 and a control gate 13. As such, M1 could be an storage element in an EEPROM or EPROM, with data to be stored impressed upon floating gate 12 as a charge. The operation of EEPROMs and EPROMs are well known to those skilled in the relevant art, and will not be described here. Clearly any data charge caused to be stored on floating gate 12 should remain there a relatively long time. However as noted, charge loss mechanisms and hot carrier degradation can in fact interfere with this stored charge.

Figure 2B:
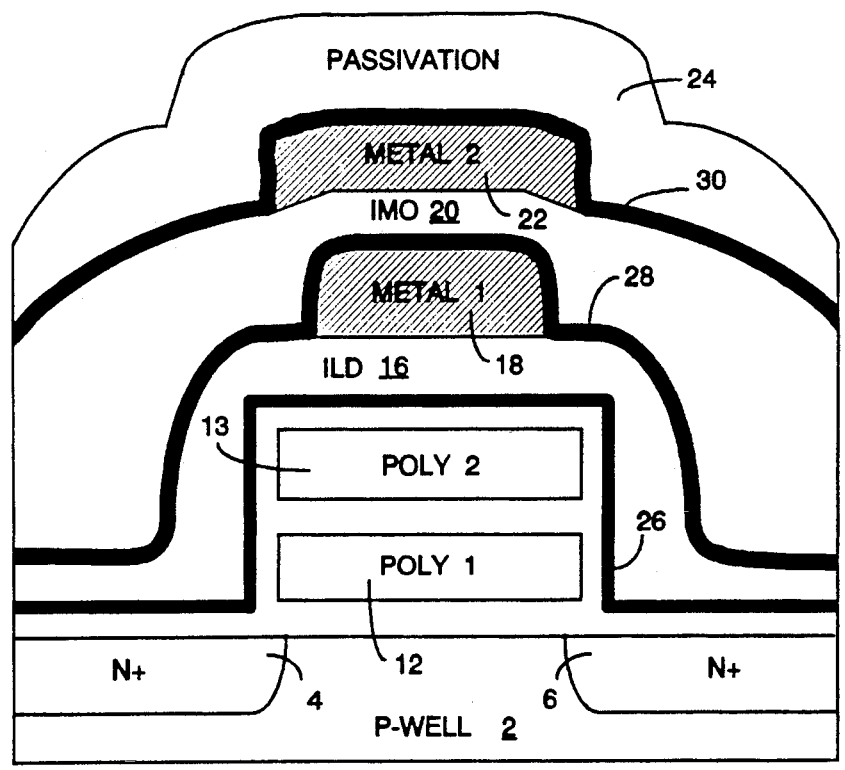
FIG. 2B is a cross-section of a MOS semiconductor implementation of the device depicted in FIG. 2A.
Figure 3B:
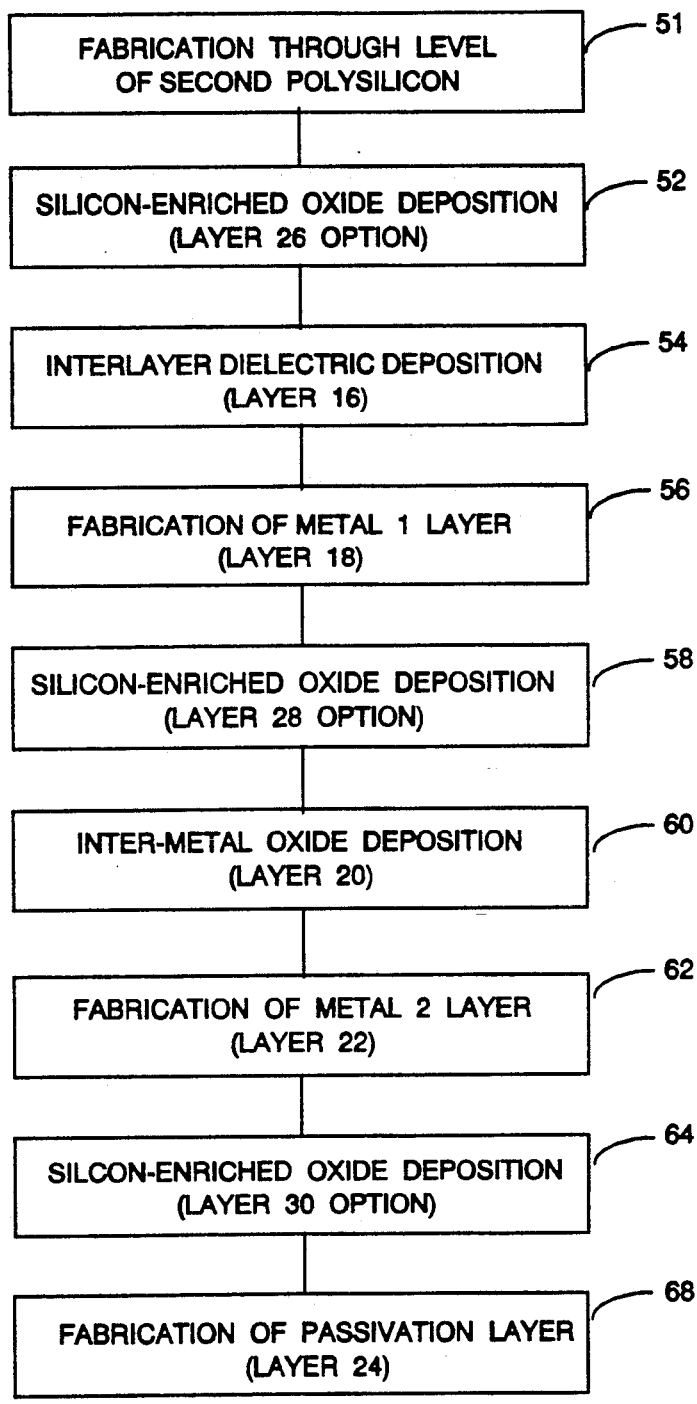
FIG. 3B is a flowchart for manufacturing the structure of FIG. 2B.

FIG. 2B and its process steps as depicted in FIG. 3B are similar to what has been described with regard to FIG. 1B and FIG. 3A, with common element reference numbers denoting the same layer or process step.

Collectively, source and drain regions 4, 6, and the portion of substrate 2 therebetween will be referred to as the active region, which together with floating gate 12 and control gate 13 comprise the EEPROM or EPROM transistor M1 depicted in FIG. 2A. After fabrication of gates 12 and 13 at, respectively, the polysilicon 1 and polysilicon 2 levels (depicted as step 52 in FIG. 3B), the remaining semiconductor levels and process steps are the same as what has been described.

As noted, the silicon-enriched oxides are deposited at step 52 and/or step 58 and/or step 64 in FIG. 2A and FIG. 3A. Preferably these steps are accomplished with plasma deposition, during which more silicon-bearing reagent than is required for stoichiometric interaction with the introduced oxidant is used. The resultant deposition (which preferably occurs at relatively low r.f. plasma power) is silicon enriched.

The effectiveness of a silicon-enriched layer, at least with regard to charge neutralization, is strongly correlated with the density of dangling bonds that are available on silicon atoms bonded with fewer than four oxygen atoms. Dangling bond density may be assessed by measuring spin density using an electron spin resonance spectrometer. A spin density of at least about $10^{17}$ per cm$^3$ should be achieved, with $10^{18}$ per cm$^3$ a more practical minimum, and $10^{19}$ per cm$^3$ preferred. By contrast, unenriched oxides have a spin density of less than $10^{16}$ per cm$^3$.

A related comparison is a preferred Si—H absorbance of at least about 0.010 versus an unenriched level of about 0.001 or less, as measured in the infrared spectrum as a peak located near the wave number 2250 for a 1.0 micron thick film. In practice, a Si—H of about 0.5% or higher will enhance hot carrier lifetime by about an order of magnitude (compared to lifetime in the absence of the silicon-enhanced layer). A further comparison is of a preferred refractive index of at least about 1.50 versus about 1.46±0.02 as measured by an ellipsometer.

In an exemplary embodiment, the thickness of a silicon-enriched oxide was about 1,000 Å to about 5,000 Å or more, deposition being accomplished with a commercially available PECVD reactor at about 400° C., and a pressure of about 2 Torr. The reactant gases used were silane (SiH$_4$), nitrous oxide (N$_2$O), and nitrogen (N$_2$). Deposition conditions were modified to enrich the PECVD oxide with silicon.

The PECVD oxide may be characterized using FTIR measurements in addition to refractive index, stress and wet etch rates. Si—O—Si stretch band position, full width at half-maximum for Si—O—Si stretch band, Si—H peak position and Si—H peak heights are useful measurements as well, as are electron spin density measurements to estimate dangling bond density.

As Si—H content increases, the refractive index and dangling bond spin densities both increase. Stoichiometric SiO$_2$ with nearly zero percent Si—H content corresponds with a refractive index of 1.452. Dangling bond spin density measurements indicate orders of magnitude higher spin densities for silicon-enhanced oxides having higher Si—H contents. The g-value of the silicon-enhanced oxide is in the range of about 2.005 and 2.006. This range correlates well with reported data wherein a first resonant line is attributed to dangling bonds in an amorphous silicon environment, and a second line is attributed to the dangling bonds at the interface between amorphous silicon and $SiO_2$ components. It is noted that at least where charge neutralization is concerned, internal passivation depends more on the defect type than the total spin densities.

In summation, use of one or more layers of silicon-enhanced oxide according to the present invention will effectively reduce EEPROM and EPROM degradation induced by backend processing. Further, when used in an SRAM device, one or more such layers will improve the stability of the polysilicon pull-up load resistors, thus improving device reliability.

Modifications and variations may be made to the disclosed embodiments without departing from the subject and spirit of the invention as defined by the following claims.

What is claimed is:

1. A method of making an integrated circuit MOS device having improved reliability, the method comprising:
   (a) forming on a substrate a plurality of MOS active devices, each including at least one gate;
   (b) forming a first layer of silicon-enriched oxide generally above a level of said substrate defined by said MOS active devices, said silicon-enriched oxide having a refractive index of at least 1.50 and having a layer thickness less than about 5,000 Å;
   wherein said first layer of silicon-enriched oxide improves operation of said MOS devices.

2. The method of claim 1, wherein at least one said MOS active device includes a first gate formed at a first gate level and a second gate formed at an overlying second gate level, said first gate adapted to store charge representing a stored data value;
   wherein said first layer of silicon-enriched oxide improves charge retention of said first gate.

3. The method of claim 1, wherein said first layer of silicon-enhanced oxide contains at least about $10^{17}$ per $cm^3$ dangling bonds.

4. The method of claim 1, wherein said first layer of silicon-enriched oxide has a thickness of about 1,000 Å to about 5,000 Å.

5. The method of claim 1, including the further steps of:
   (c) providing an interlayer dielectric disposed generally above a level defined by said MOS active devices; and
   (d) providing a first pattern of metal traces at a first trace level generally overlying said interlayer dielectric;
   wherein said first layer of silicon-enriched oxide is disposed at immediately beneath said interlayer dielectric.

6. The method of claim 1, including the further steps of:
   (c) providing an interlayer dielectric disposed generally above a level defined by said MOS active devices; and
   (d) providing a first pattern of metal traces at a first trace level generally overlying said interlayer dielectric;
   wherein said first layer of silicon-enriched oxide is disposed above said interlayer dielectric and first trace level.

7. The method of claim 1, including the further step of forming a passivation layer generally above a level defined by said MOS active devices;
   wherein said first layer of silicon-enriched oxide is disposed adjacent and immediately beneath said passivation layer.

8. The method of claim 1, including the further step of forming a polysilicon resistor at a level substantially equal to a gate level of at least one said MOS device, said polysilicon resistor having a first end coupled to said at least one MOS device;
   wherein said first layer of silicon-enriched oxide preserves stability of said polysilicon resistor.

9. The method of claim 8, including the further steps of:
   (c) providing an interlayer dielectric disposed generally above a level defined by said MOS active devices; and
   (d) providing a first pattern of metal traces at a first trace level generally overlying said interlayer dielectric;
   wherein said first layer of silicon-enriched oxide is disposed at immediately beneath said interlayer dielectric.

10. The method of claim 8, including the further steps of:
    (c) providing an interlayer dielectric disposed generally above a level defined by said MOS active devices; and
    (d) providing a first pattern of metal traces at a first trace level generally overlying said interlayer dielectric;
    wherein said first layer of silicon-enriched oxide is disposed above said interlayer dielectric and first trace level.

11. The method of claim 8, including the further step of forming a passivation layer generally above a level defined by said MOS active devices;
    wherein said first layer of silicon-enriched oxide is disposed adjacent and immediately beneath said passivation layer.

12. The method of claim 1, wherein step (b) is carried out at a temperature of about 400° C.

13. The method of claim 1, wherein step (b) is carried out using plasma enhanced chemical vapor deposition ("PECVD").

14. The method of claim 1, wherein step (b) is carried out using silane, nitrous oxide and nitrogen.

15. The method of claim 1, wherein said plurality of MOS active devices includes a plurality of MOS memory devices.

16. The method of claim 15, wherein said first layer of silicon-enriched oxide contains at least about $10^{17}$ per $cm^3$ dangling bonds.

17. The method of claim 15, wherein step (b) is carried out at a temperature of about 400° C.

* * * * *